(12) United States Patent
Ricard et al.

(10) Patent No.: US 7,902,859 B2
(45) Date of Patent: Mar. 8, 2011

(54) INPUT/OUTPUT CIRCUITRY WITH COMPENSATION BLOCK

(75) Inventors: Nicolas Ricard, Coublevie (FR); Laurent Jean Garcia, Saint Martin d'Heres (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 12/579,951

(22) Filed: Oct. 15, 2009

(65) Prior Publication Data
US 2010/0097093 A1 Apr. 22, 2010

(30) Foreign Application Priority Data
Oct. 16, 2008 (FR) ...................................... 08 57026

(51) Int. Cl.
*H03K 17/16* (2006.01)
*H03K 19/003* (2006.01)
(52) U.S. Cl. .................. 326/30; 326/32; 326/34; 326/87
(58) Field of Classification Search .......................... None
See application file for complete search history.

(56) References Cited

U.S. PATENT DOCUMENTS

| | | | |
|---|---|---|---|
| 3,702,447 A | 11/1972 | Koning | |
| 5,045,809 A | 9/1991 | Cho | |
| 5,131,046 A | 7/1992 | Killion et al. | |
| 6,020,787 A | 2/2000 | Kim et al. | |
| 6,762,620 B2 * | 7/2004 | Jang et al. | 326/30 |
| 2007/0279130 A1 | 12/2007 | Furuta | |
| 2008/0054937 A1 * | 3/2008 | Kinoshita et al. | 326/30 |
| 2009/0289658 A1 * | 11/2009 | Moon | 326/30 |

OTHER PUBLICATIONS

French Search Report, dated Oct. 9, 2009, from French Application No. 08/57026.

* cited by examiner

*Primary Examiner* — Anh Q Tran
(74) *Attorney, Agent, or Firm* — Lisa K. Jorgenson; James H. Morris; Wolf, Greenfield & Sacks, P.C.

(57) ABSTRACT

Circuitry including an output circuit having a first variable resistance block coupled between a first supply voltage and an output node, the first variable resistance block having a plurality of selectable resistive elements coupled in series with at least one resistor between the first supply voltage and the output node, the output circuit having an output impedance determined by the resistance of the first variable resistance block; and a compensation circuit for regulating the impedance of the first variable resistance block of the output circuit, the compensation circuit having a second variable resistance block coupled between the first supply voltage and the first node of an external resistor, the second node of the external resistor being coupled to a second supply voltage, wherein the second variable resistance block comprises a plurality of selectable resistive elements coupled in series with at least one resistor between the first supply voltage and the first node of the external resistor, and wherein the plurality of selectable resistive elements of the first and second variable resistance blocks are selected based on a voltage level at the first node of the external resistor.

25 Claims, 5 Drawing Sheets

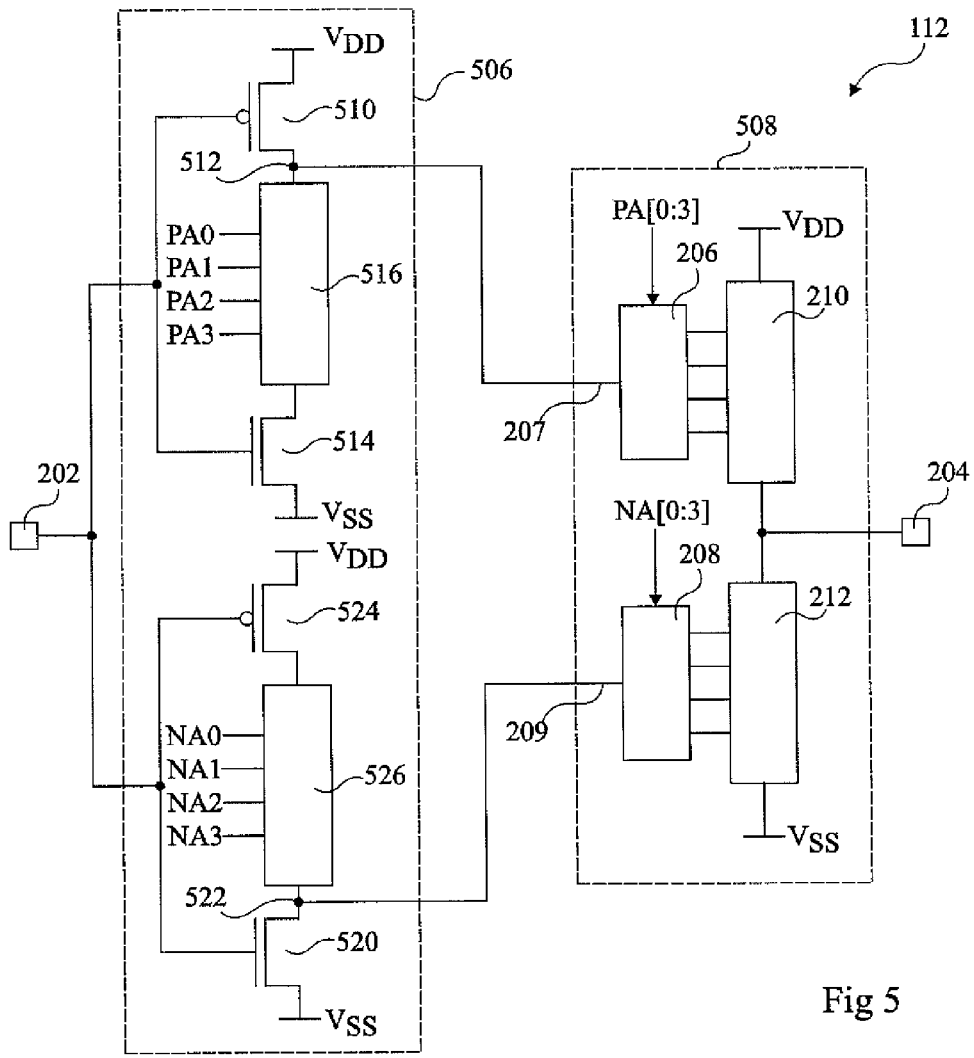
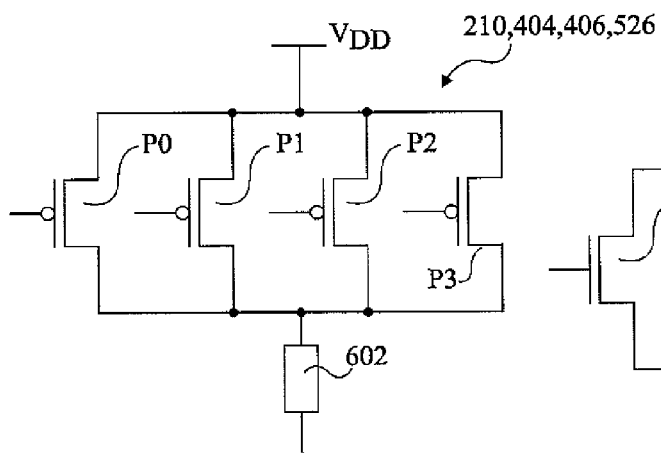
Fig 6A
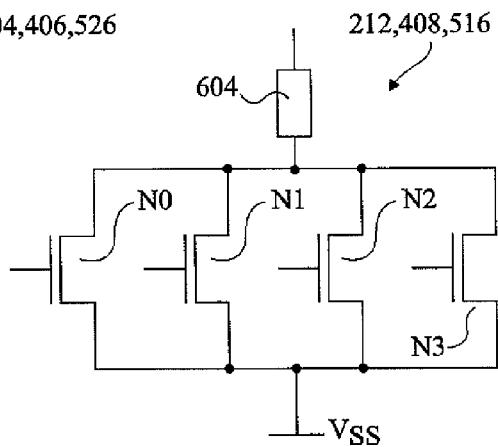
Fig 6B

INPUT/OUTPUT CIRCUITRY WITH COMPENSATION BLOCK

CROSS REFERENCE TO RELATED APPLICATIONS

This application claims the priority benefit of French patent application number 08/57026, filed on Oct. 16, 2008, entitled "INPUT/OUTPUT CIRCUITRY WITH COMPENSATION BLOCK," which is hereby incorporated by reference to the maximum extent allowable by law.

Field of the Invention

The present invention relates to circuitry comprising a compensation block for regulating the output impedance of an output buffer of the circuitry.

BACKGROUND OF THE INVENTION

When signals are output from one integrated circuit to another via connections on a PCB (Printed Circuit Board), it is generally necessary to amplify them in order to overcome large parasitic capacitance charges present at the two PCB-integrated circuit interfaces. These parasitic charges degrade the signal and thus limit the maximum frequency at which the signal can be transmitted. Output buffers and often pre-amplifiers are used to amplify the output signals. Furthermore, to ensure signal integrity of the transmitted signal at the destination circuit, impedance matching is often performed, such that the impedance of the output buffers matches the impedance of the PCB lines.

Signal integrity includes factors such as signal overshoots, signal slopes, propagation delays and signal to noise ratios, these factors determining when data can be correctly received at the destination circuit. However, due to varying PVT (Process, Voltage and Temperature) conditions, the output impedance of the output buffers in transmission mode may vary at different operating conditions, and can lead to a mismatch between the output impedance and the impedance of the PCB lines, leading to a degradation of the signal integrity.

As clock speeds increase, the rate of data transmission on such PCB lines is also increasing. This makes signal integrity all the more important, and thus precise impedance matching of the impedance of the output buffer with the impedance of the PCB lines for all PVT conditions is critical.

While some solutions exist for matching the output impedance of the output buffers to the impedance of the PCB lines, such solutions are generally inadequate for providing acceptable signal integrity at increased data rates.

SUMMARY OF THE INVENTION

It is an aim of embodiments of the present invention to at least partially address one or more problems in the prior art.

According to one aspect of the present invention, there is provided circuitry comprising an output circuit comprising a first variable resistance block coupled between a first supply voltage and an output node, the first variable resistance block comprising a plurality of selectable resistive elements coupled in series with at least one resistor between the first supply voltage and the output node, the output circuit having an output impedance determined by the resistance of the first variable resistance block; and a compensation circuit for regulating the impedance of the first variable resistance block of the output circuit, the compensation circuit comprising a second variable resistance block coupled between said first supply voltage and the first node of an external resistor, the second node of the external resistor being coupled to a second supply voltage, wherein the second variable resistance block comprises a plurality of selectable resistive elements coupled in series with at least one resistor between the first supply voltage and the first node of the external resistor, and wherein said plurality of selectable resistive elements of the first and second variable resistance blocks are selected based on a voltage level at said first node of the external resistor.

According to one embodiment of the present invention, the plurality of selectable resistive elements of the first and second variable resistance blocks are transistors.

According to another embodiment of the present invention, the at least one resistors of the first and second variable resistance blocks are integrated resistors.

According to another embodiment of the present invention, the circuitry further comprises a third variable resistance block coupled between said second supply voltage and said output node and comprising a plurality of selectable resistive elements coupled in series with at least one resistor; said compensation circuit further comprising a fourth variable resistance block coupled between the second supply voltage and a feedback node, the fourth variable resistance block comprising a plurality of selectable resistive elements coupled in series with at least one resistor, the selectable resistive elements of the third and fourth variable resistance blocks being selected based on a voltage level at the feedback node; and the resistive elements of the first and second variable resistance blocks being transistors of a first type, and the resistive elements of the third and fourth variable resistance blocks being transistors of a second type.

According to another embodiment of the present invention, the compensation circuit further comprises a fifth variable resistance block identical to the second variable resistance block and coupled between the first supply voltage and the feedback node, wherein the selectable resistance elements of the fifth variable resistance block are selected based on the voltage at the first node of the external resistor.

According to another embodiment of the present invention, the circuitry comprises a preamplifier comprising: first and second output nodes coupled to said first and third variable resistance blocks respectively; a sixth variable resistance block coupled to the first output node and comprising selectable resistive elements selected based on the voltage at the feedback node; and a seventh variable resistance block coupled to the second output node and comprising selectable resistive elements selected based on the voltage at the first node of the external resistor.

According to another embodiment of the present invention, the dimensions of selectable resistive elements of the first and third variable resistance blocks are different by a determined ratio to those of the selectable resistive elements of the sixth and seventh variable resistance blocks, and the dimensions of the at least one resistor of the first and third variable resistance blocks are different by said determined ratio to the at least one resistors of the sixth and seventh variable resistance blocks.

According to another embodiment of the present invention, the compensation circuitry is arranged to provide a plurality of control signals, one for each of the plurality of selectable resistive elements of the first variable resistance block, said control signals determined based on the voltage at the first node of the external resistor, the output circuitry further comprising control logic arranged to control the plurality of selectable resistive elements of the first variable resistance block based on said plurality of control signals and an input signal from an input node of said output circuit.

According to another embodiment of the present invention, the input circuit comprises a first variable resistance block coupled between the first supply voltage and an input node, the first variable resistance block comprising a plurality of selectable resistive elements coupled in series with at least one resistor between the first supply voltage and the input node, the input circuit having an input impedance determined by the resistance of the first variable resistance block of the input circuit, wherein the plurality of selectable resistive elements of the first variable resistance block of the input circuit are selected based on said voltage level at said first node of the external resistor of the compensation circuit.

According to a further aspect of the present invention, there is provided a PCB (printed circuit board) comprising first and second integrated circuits coupled together by at least one printed connection on said PCB, wherein at least one of said first and second integrated circuits comprises the above circuitry.

According to another embodiment of the present invention, at least one of the first and second integrated circuits is an external memory device.

According to one aspect of the present invention, there is provided an electronic device comprising a first integrated circuit coupled to a second integrated circuit via at least one conducting track, said first integrated circuit comprising the above circuitry coupled to said at least one conducting track, wherein one of said first and second integrated circuits is an external memory device.

According to one aspect of the present invention, there is provided a method of regulating the output impedance of an output circuit comprising a first variable resistance block coupled between a first supply voltage and an output node, the first variable resistance block comprising a plurality of selectable resistive elements coupled in series with at least one resistor between the first supply voltage and the output node, the method comprising: adjusting a plurality of control signals to select a plurality of resistive elements in a second variable resistance block, the resistive elements being coupled in series with at least one resistor between said first supply voltage and the first node of an external resistor, the second node of the external resistor being coupled to a second supply voltage, wherein said adjustment is based on the voltage at the first terminal of the external resistor; and selecting one or more of the plurality of resistive elements of the first variable resistance block based on said plurality of control signals.

According to another embodiment of the present invention, the output circuit further comprises a third variable resistance block coupled between the second supply voltage and said output node, the method further comprising: adjusting a further plurality of control signals to select a plurality of resistive elements in a fourth variable resistance block coupled between said second supply voltage and a feedback node, wherein said adjustment is based on the voltage at the feedback node; and selecting one or more of the plurality of resistive elements of the third variable resistance block based on said further plurality of control signals.

According to another embodiment of the present invention, the resistive elements of the first and second variable resistance blocks are transistors of a first type and the resistive elements of the third and fourth variable resistance blocks are transistors of a second type different to the first type.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which:

FIG. 5 illustrates a communications interface according to a further embodiment of the present invention;

FIGS. 6A and 6B illustrate PMOS and NMOS variable resistance blocks respectively according to embodiments of the present invention;

DETAILED DESCRIPTION

Figure 1:
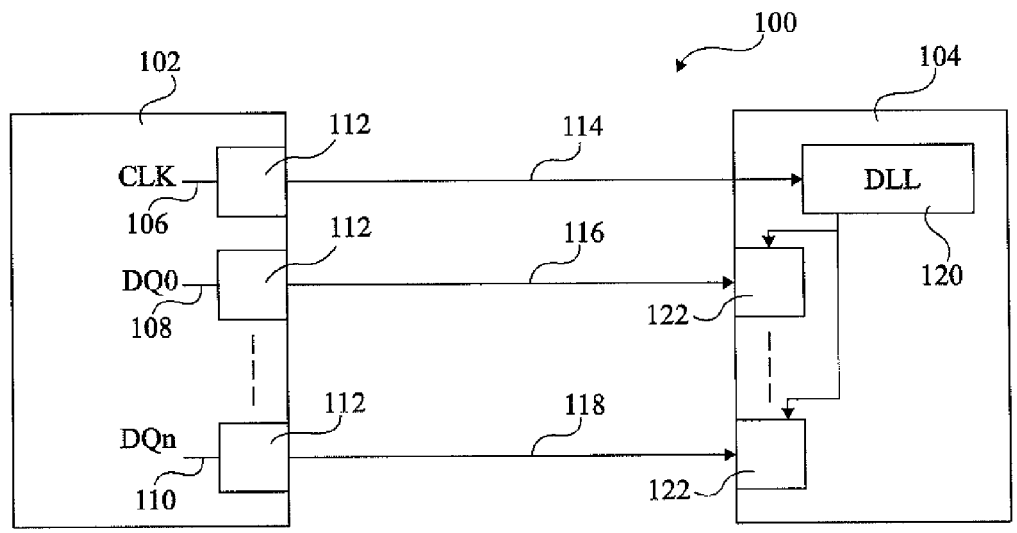
FIG. 1 illustrates an interface between two circuits comprising circuitry according to embodiments of the present invention.

FIG. 1 illustrates circuitry 100 comprising a first circuit 102 and a second circuit 104 on a PCB. Each of the circuits 102, 104 is for example an integrated circuit, and circuits 102, 104 are arranged to communicate with each other. As an example, circuit 102 is a processor comprising a memory controller, and circuit 104 an external memory device.

A clock signal CLK on line 106 and data signals DQ0 to DQn on lines 108 to 110 are transmitted from circuit 102 to circuit 104, via communications interfaces 112 of circuit 102. A communications interface 112 is provided for each clock/data line, and each comprises an output buffer. Conducting lines 114 and 116 to 118 couple the communications interfaces 112 of circuit 102 to circuit 104. Each of the conducting lines 114 to 118 has an associated impedance. Clock line 114 is coupled to a DLL (delay-locked loop) or a PLL (phase-locked loop) 120 of circuit 104, while data lines 116 to 118 are coupled to communications interfaces 122 of circuit 104, which each comprise input buffers. Communications interfaces 122 are clocked by an output from the DLL/PLL 122.

Each communications interface 112 of circuit 102 has a variable output impedance that can be adjusted to match an impedance of the respective conducting lines 114 to 118, as will now be described.

Figure 2:
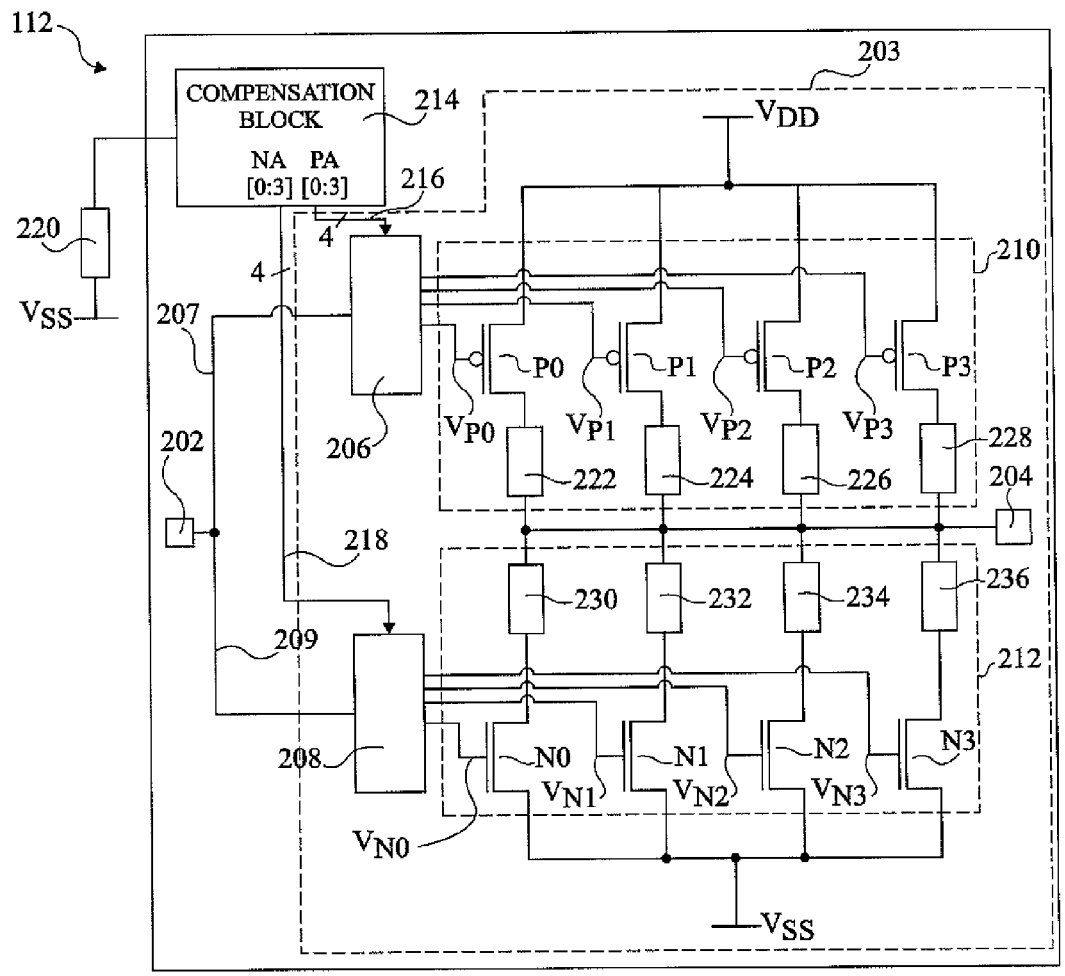
FIG. 2 illustrates a communications interface according to an embodiment of the present invention.

FIG. 2 illustrates an embodiment of one of the communications interfaces 112.

An input node 202 receives the clock/data signal to be transmitted via an output circuit 203 of the communications interface 112. An output node 204 is coupled to the conducting line (not shown in FIG. 2) on which the clock/data signal is to be transmitted.

Input node 202 is coupled to the output circuit 203, and in particular to the control logic block 206, via line 207 and to a control logic block 208 via a line 209. Outputs from control logic blocks 206 and 208 control variable resistance blocks 210 and 212 respectively. Variable resistance block 210 is coupled between the supply voltage $V_{DD}$ and the output node 204, while variable resistance block 212 is coupled between the supply voltage $V_{SS}$, and the output node 204. Supply voltage $V_{DD}$ is for example at 1.5 V, while supply voltage $V_{SS}$ is for example at 0 V or a different voltage.

A compensation block 214 provides control signals PA[0: 3] to logic block 206 on lines 216 and control signals NA[0:3] to logic block 208 on lines 218. Compensation block 214 is coupled to an external resistor 220, which is in turn coupled to $V_{SS}$. Compensation block 214 determines the control signals on lines 216 and 218 based on the resistance of external resistor 220, and in particular based on the voltage at the terminal of resistor 220 coupled to the compensation block 214.

Variable resistance block 210 comprises four selectable resistive elements coupled in parallel between an output node 204 and the supply voltage $V_{DD}$. Each of the selectable resistive elements is in the form of a p-channel MOS (PMOS) transistor P0 to P3 respectively, each coupled by its source/drain nodes between the supply voltage $V_{DD}$ and one terminal of a respective resistor 222, 224, 226 and 228, each of which is integrated on chip. Resistors 222 to 228 are for example formed in polysilicon. The other terminals of resistors 222 to 228 are coupled to the output node 204. The gate nodes of transistors P0 to P3 are coupled to control logic block 206 for receiving control signals $V_{P0}$ to $V_{P3}$ respectively.

Variable resistance block 212 comprises four selectable resistive elements coupled in parallel between output node 204 and supply voltage $V_{SS}$. Each of the selectable resistive elements is in the form of a n-channel MOS (NMOS) transistors N0 to N3 respectively, each coupled by its source/drain nodes between the supply voltage $V_{SS}$ and one terminal of a respective resistor 230, 232, 234 and 236, each of which is integrated on chip. Resistors 230 to 236 are for example formed in polysilicon. The other terminals of resistors 230 to 236 are coupled to the output node 204. The gate nodes of transistors N0 to N3 are coupled to control logic block 208 for receiving control signals $V_{N0}$ to $V_{N3}$ respectively.

In operation, the control signals NA[0:3] and PA[0:3] control which PMOS transistors P0 to P3 and which NMOS transistors N0 to N3 are activated to receive the input signal. The number of PMOS and NMOS transistors selected determines the output impedance of the output circuitry. For example, the output impedance on the PMOS side will equal the parallel resistances of each of the activated branches, each branch having a resistance equal to the on resistance of the respective PMOS transistor P0 to P3 in series with the resistance of the associated resistor 222 to 228. The resistors 222 to 228 for example have a resistance representing a substantial proportion of the total impedance of each branch, for example between 50 and 90 percent, and preferable approximately 80 percent of the total resistance of each branch. The same applies to the NMOS side.

The control signals NA[0:3] and PA[0:3] are determined based on the resistance of the external resistor 220, which is chosen to have a resistance equal to or a multiple of the impedance of the conducting line on which the output signal is to be transmitted from node 204.

Figure 3A:
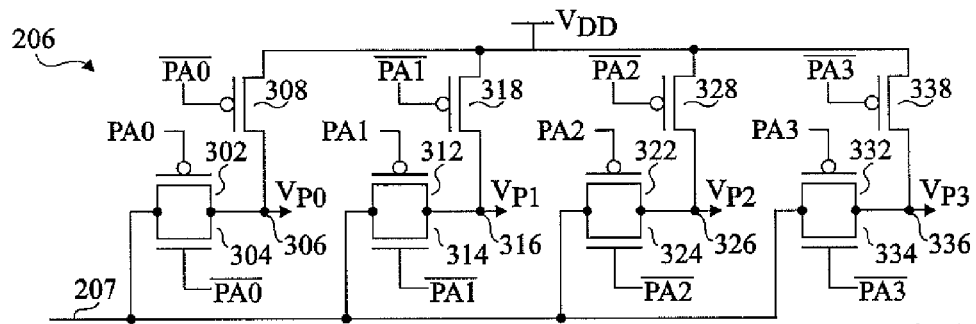
FIGS. 3A and 3B illustrate the control logic blocks of FIG. 2 for providing control signals to the variable resistance blocks according to an embodiment of the present invention.

FIG. 3A illustrates the control logic block 206 of FIG. 2 in more detail. The input line 207 from the input node 202 of FIG. 2 is coupled to one source/drain node of a PMOS transistor 302 and an NMOS transistor 304, which are coupled in parallel with each other. The other source/drain nodes of transistors 302 and 304 are coupled to a node 306, which provides the signal $V_{P0}$ for controlling the first PMOS P0 of the variable resistance block of FIG. 2. Node 306 is also coupled to the supply voltage $V_{DD}$ via a PMOS transistor 308. The gate node of PMOS 302 receives the first control signal PA0 provided by the compensation block 214 of FIG. 2, while NMOS 304 and PMOS 308 receive the inverse of PA0.

Transistors 312, 314, node 316 and transistor 318 are arranged in the same way as transistors 302, 304, node 306 and transistor 308 respectively, between the input line 207 and the supply voltage $V_{DD}$. PMOS 312 receives the control signal PA1, while NMOS 314 and PMOS 318 receive the inverse of PA1, and node 316 provides the control voltage $V_{P1}$ to transistor P1 in FIG. 2. Similarly, transistors 322, 324, node 326 and transistor 328 are arranged in the same way as transistors 302, 304, node 306 and transistor 308 respectively, between the input line 207 and the supply voltage $V_{DD}$. PMOS 322 receives the control signal PA2, while NMOS 324 and PMOS 328 receive the inverse of PA2, and node 326 provides the control voltage $V_{P2}$ to transistor P2 in FIG. 2. Similarly again, transistors 332, 334, node 336 and transistor 338 are arranged in the same way as transistors 302, 304, node 306 and transistor 308 respectively, between the input line 207 and the supply voltage $V_{DD}$. PMOS 332 receives the control signal PA3, while NMOS 334 and PMOS 338 receive the inverse of PA3, and node 336 provides the control voltage $V_{P3}$ to transistor P3 in FIG. 2.

Thus when the control signal PA0 is high, PMOS 302 and 304 are non-conducting, and node 306 is coupled to $V_{DD}$ by PMOS 308, such that transistor P0 is non-conducting. On the other hand, when PA0 is low, transistors 302 and 304 conduct, and transistor 308 is non-conducting. The input signal on line 207 is thus coupled to the gate node of P0. Likewise, when PA1, PA2 or PA3 are high, transistors P1, P2 or P3 respectively are non-conducting, and when PA1, PA2 or PA3 are low, transistors P1, P2 or P3 respectively receive the input signal from line 207.

Figure 3B:
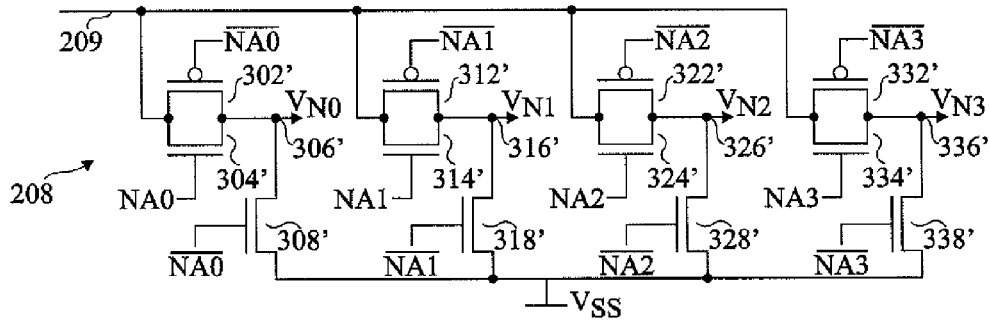

FIG. 3B illustrates the control logic block 208 of FIG. 2 in more detail. It is identical to control logic block 206, except that each group of transistors is coupled between line 209 and the supply voltage $V_{SS}$. The transistors and nodes have been labeled with the same reference numerals as corresponding elements in FIG. 3A, but with the addition of an apostrophe. As illustrated, the transistors 308', 318', 328' and 338' are NMOS rather than PMOS transistors, and the transistors all receive the NMOS versions for the control signals NA[0:3] rather than the PMOS versions, except that the PMOS transistors 302', 312', 322' and 332' receive the inverse of NA0, NA1, NA2 and NA3 respectively, while NMOS transistors 304', 314', 324' and 334' receive signals NA0, NA1, NA2 and NA3 respectively.

Operation of the control logic 208 is the same as that of control logic 206, and will not be described again in detail.

Figure 4A:
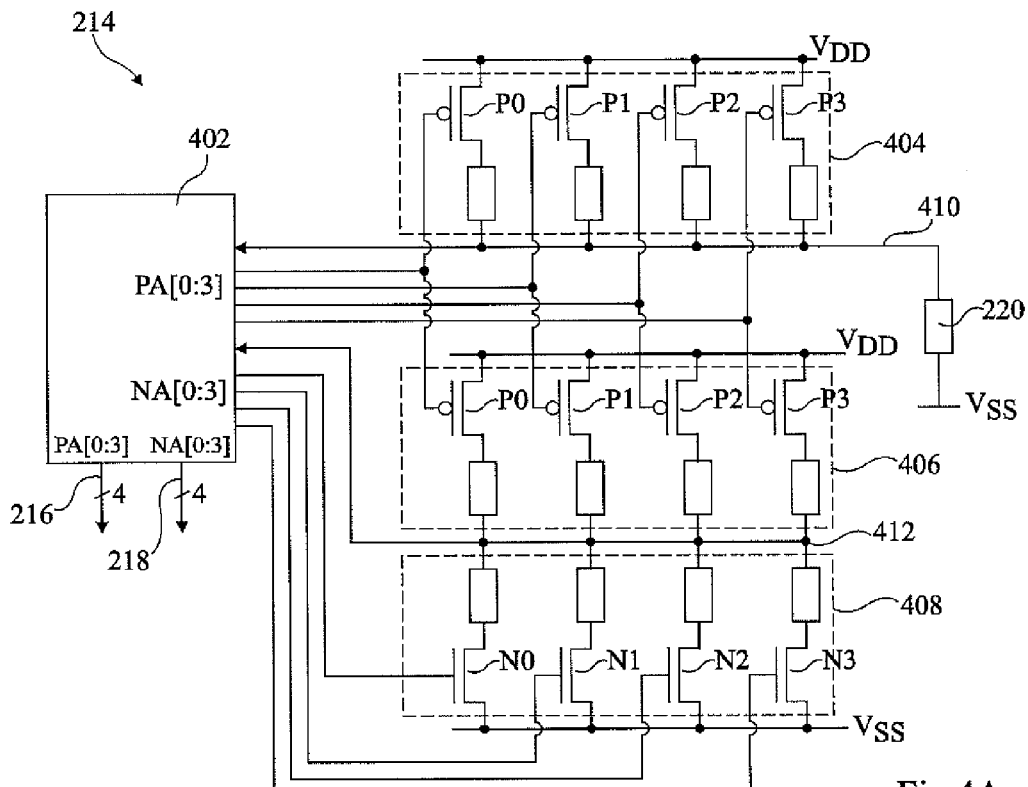
FIG. 4A illustrates the compensation circuitry of FIG. 2 according to an embodiment of the present invention.

FIG. 4A illustrates compensation block 214 for determining the control voltages PA[0:3] and NA[0:3] provided to the control logic blocks 206 and 208 of FIGS. 3A and 3B respectively.

The compensation block 214 comprises a control block 402 that outputs the control signals PA[0:3] and NA[0:3] on lines 216 and 218 to control logic blocks 206 and 208 respectively of FIG. 2. Control signals PA[0:3] are also provided to control variable resistance blocks 404 and 406 of the compensation block 214, while control signals NA[0:3] are provided to control a variable resistance block 408 of the compensation block 214. Variable resistance blocks 404 and 406 are the same as variable resistance block 210 of FIG. 2, while variable resistance block 408 is the same as variable block 212 of FIG. 2, and these blocks in FIG. 4A will not be described again in detail.

The variable resistance block 404 is coupled between the supply voltage $V_{DD}$ and a node 410, which provides a feedback signal to the control block 402. Node 410 is also coupled to one terminal of the external resistor 220 of FIG. 2, the other terminal of which is coupled to the supply voltage $V_{SS}$.

The variable resistance block 406 is coupled between the supply voltage $V_{DD}$ and a node 412, which provides a further feedback to signal to control block 402. Given that variable resistance block 406 is controlled by the same control signals as variable resistance block 404, and that it is identical, it will have the same impedance as block 404. The variable resistance block 408 is coupled between the supply voltage $V_{SS}$ and node 412.

In operation, during a first phase, the control signals PA[0:3] are determined. For this, the control block 402 systematically adjusts the control signals PA[0:3] until the voltage on node 410 is closest to a desired value.

Figure 4B:
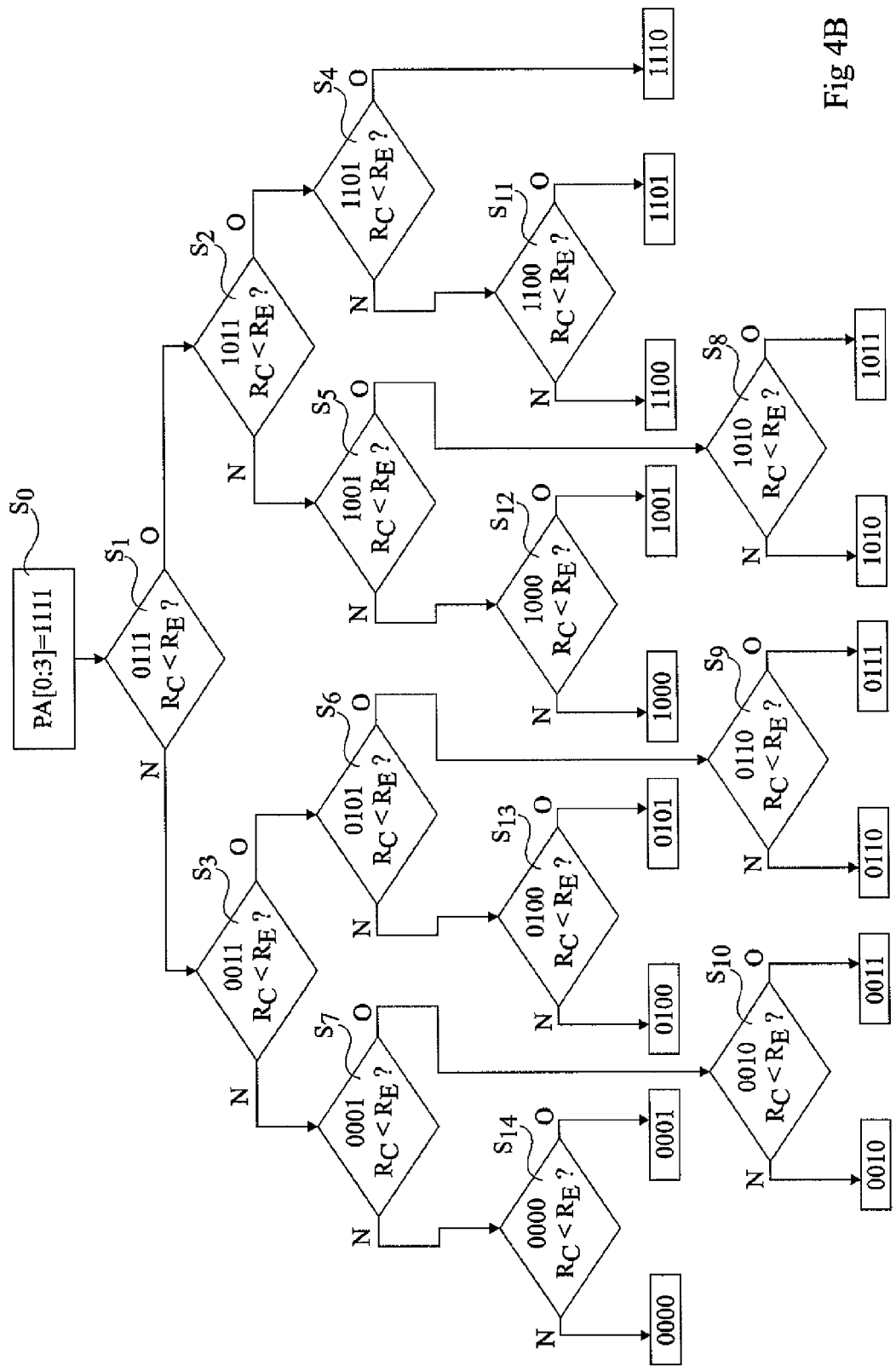
FIG. 4B is a flow diagram illustrating steps in a calibration method according to an embodiment of the present invention.

FIG. 4B is a flow diagram illustrating an example of steps in a calibration sequence for calibrating the control signals PA[0:3].

According to this example, the width, and thus the on resistance $R_{on}$ of each of the transistors P0 to P3 of the variable resistance block 404 are different, with P0 the lowest resistance and P3 the highest resistance.

In an initial step $S_0$, each of the control signals PA[0:3] is set to logic "1", thereby making the PMOS transistors P0 to P3 non-conducting. After $S_0$, each of the transistors P0 to P3 are tested in turn to determine whether they should be on or off, as will now be explained.

In $S_1$, a first code for PA[0:3] is applied by control block 402 to activate the least resistive transistor, in this example transistor P0. The first code is thus PA[0:3]=0111. It is then determined whether this code results in $R_C<R_E$, in other words whether the impedance $R_C$ of the variable resistance block 404 is lower than the resistance $R_E$ of the external resistance. This can be determined based on whether the voltage on node 410 of FIG. 4A is higher than the desired value. If so, it is determined that P0 should be off, and the next step is $S_2$. On the other hand, if $R_C \geq R_E$, then P0 should be on, and the next step is $S_3$.

In steps $S_2$ and $S_3$, transistor P1, which has the next lowest resistance, is activated.

In particular, in step $S_2$, the code PA[0:3]=1011 is applied by the control block 402, such that P0 is switched off again and transistor P1 is activated. It is then determined whether this code results in $R_C<R_E$, and if so, the next step is S4 in which P1 is switched off again, and if not the next step is S5 in which P1 remains on.

In S3, the code PA[0:3]=0011 is applied by the control block 402, such that P0 remains activated, and transistor P1 is also activated. It is then determined whether this code results in $R_C<R_E$, and if so, the next step is S6 in which P1 is switched off again, and if not the next step is S7 in which P1 remains on.

In steps S4, S5, S6 and S7, transistor P2, which is the next lowest resistance after P1, is activated by applying the codes PA[0:3]=1101, PA[0:3]=1001, PA[0:3]=0101 and PA[0:3]=0001 respectively. In each of these steps it is determined whether the code results in $R_C<R_E$. If so, after S4, the control signals PA[0:3] are determined as being equal to "1110", and after each of steps S5, S6 and S7, the next step is S8, S9 and S10 respectively. If not, the next step after each of steps S4, S5, S6 and S7 is S11, S12, S13 and S14 respectively.

In steps S8 to S10, P2 is switched off, and transistor P3 is activated. The codes applied in S8 to 810 are PA[0:3]=1010, PA[0:3]=0110 and PA[0:3]=0010 respectively.

In steps 811 to S14, P2 remains on, and transistor P3 is activated. The codes applied are PA[0:3]=1100, PA[0:3]=1000, PA[0:3]=0100 and PA[0:3]=0000 respectively.

After each of steps S8 to S14, the control signals PA[0:3] are determined as being equal to the code applied in each of these steps, with a "1" for transistor P3 if it is determined in these steps that $R_C<R_E$, and a "0" for transistor P3 if it is determined that $R_C$ is not lower than $R_E$.

Thus, the control signals PA[0:3] can be determined by performing at most four steps in sequence:

a first step corresponding to S1 in FIG. 4B;
a second step corresponding to either S2 or S3 in FIG. 4B;
a third step corresponding to one of S4, S5, S6 or S7 in FIG. 4B; and, except where it is determined that transistors P0, P1 and P2 should be off,
a fourth step corresponding to one of S8 to S14 of FIG. 4B.

Only three steps are performed in the case that it is determined that each of transistors P0, P1 and P2 should be off, as at least one transistor should be on, and thus PA[0:3]=1111 is not a valid control signal.

The control signals PA[0:3] that have been determined can be stored and output on lines 216 to control the output circuit accordingly.

With reference again to FIG. 4A, assuming that resistor 220 has the same resistance as the conducting line, i.e. the desired resistance of the variable resistance blocks, the desired value of the voltage on line 410 will be the mid-point between $V_{DD}$ and $V_{SS}$. Alternatively, in some embodiments resistor 220 is selected to have a resistance equal to a multiple M of the resistance of the variable resistance blocks, where M is for example twice their resistance. In this case, a desired voltage different from the mid-point could be used. Alternatively, when a multiple M of the PCB line resistance is used for the resistor 220, the control signals PA[0:3] could still be determined using VDD/2, but the output circuit could comprise M of the resistance blocks 210 coupled in parallel.

During a second phase of operation, the control signals NA[0:3] are determined. For this, the determined control signals PA[0:3] are applied to variable resistance block 406, and control block 402 systematically adjusts the control signals NA[0:3] until the voltage at node 412 is closest to the desired value, which is the same as the desired value used for node 410. The transistors N0 to N3 for example also have varying width and thus varying on resistances, and may be controlled in the same way as for the PMOS transistors P0 to P3 as explained above in relation to FIG. 4B, except that a high voltage is used to turn them on. As soon as the desired voltage is reached, the associated values of N0 to N3 are stored and output on lines 218 to control the output circuit accordingly.

A calibration to determine the control signals NA[0:3] and PA[0:3] is for example performed once during initialization of the circuitry before data transmission, and these values are valid for all subsequent transmission. Alternatively, regular recalibration can be performed, for example every minute, or after a certain number of data packets have been transmitted. Generally, during an initialization phase, the control signals NA[0:3] and PA[0:3] are determined for an ambient temperature, and these values may generally be used for a relatively wide range of temperatures. In some examples, a sensor could trigger a new calibration phase if the temperature exceeds a certain level.

FIG. 5 illustrates an alternative embodiment of the communications interface 112. The compensation block 214 and external resistor 220 are not shown and are for example the same as those of FIG. 4A and will not be described again.

The input signal is received at an input node 202, and an output node 204 provides the signal to be transmitted on a conducting line. Between the input and output nodes 202, 204, a preamplifier 506 is provided having its inputs coupled to input node 202 and its outputs coupled to the inputs of an output buffer 508, which in turn has its output coupled to the output node 204.

The output buffer 508 is for example identical to the output circuit 203 of FIG. 2, except that in FIG. 5 the input on lines 207 and 209 are provided by different outputs of the preamplifier 506.

In this embodiment, the preamplifier 506 also has a variable output impedance, as will now be explained.

The preamplifier 506 comprises a PMOS 510 having its gate node coupled to the input node 202, and its source/drain nodes coupled between the supply voltage $V_{DD}$ and an output node 512, which is coupled to line 207. An NMOS 514 also has its gate node coupled to the input node 202, and its source/drain nodes coupled between the supply voltage $V_{SS}$ and one terminal of a variable resistance block 516, which has its other terminal coupled to output node 512. Variable resistance block 516 is for example identical to the variable resistance block 212 of FIG. 2, except that transistors N0 to N3 are coupled to a source/drain node of transistor 514 rather than directly to $V_{SS}$.

The preamplifier 506 further comprises an NMOS 520 having its gate node coupled to the input node 502, and its source/drain nodes coupled between the supply voltage $V_{SS}$ and an output node 522, which is coupled to line 209. A PMOS 524 also has its gate node coupled to the input node 202, and its source/drain nodes coupled between the supply voltage $V_{DD}$ and one terminal of a variable resistance block 526, which has its other terminal coupled to output node 522. Variable resistance block 526 is for example identical to the variable resistance block 210 of FIG. 2, except that transistors P0 to P3 are coupled to a source/drain node of transistor 524 rather than directly to $V_{DD}$.

In operation, the NMOS transistors N0 to N3 of the variable resistance block 516 and the PMOS transistors P0 to P3 of the variable resistance block 526 are controlled directly by the control signals NA[0:3] and PA[0:3] respectively, which are determined by the compensation block 214 as described above. This has the effect of adjusting the output impedance seen at nodes 512 and 524 and thus improving control of the slopes of the rising edges at node 209 and falling edges at node 209.

In the embodiment of FIG. 5, there may be a ratio between the resistance of the variable resistance blocks 516 and 526 of the preamplifier 506, and variable resistance blocks 210 and 212 of the output buffer. For example, the resistances used in the preamplifier 506 may be ten times greater than those of the output buffer 508. To achieve this, the external resistor 220 of the compensation circuitry for example has a resistance of ten times the impedance of the conducting line, for example of around 500 ohms and ten of each of the variable resistance blocks 210 and 212 are provided in the output buffer 508, coupled in parallel such that the combined impedance is one tenth of a single variable resistance block, for example around 50 ohms.

Alternatively, a single pair of variable resistance blocks 210 and 212 is provided in the output buffer 508, but the transistors P0 to P3 and N0 to N3 are ten times as wide as those of the variable resistance blocks 516 and 526. Furthermore, the integrated resistors 222 to 228 and 230 to 236 have a resistance equal to one tenth of those of the variable resistance blocks 516 to 526 of the preamplifier. In this way, there is a fixed ratio between the variable resistance blocks of the preamplifier 506 and of the output buffer 508.

FIG. 6A illustrates the variable resistance blocks 210, 404, 406 and/or 526 according to an alternative embodiment. Rather than each PMOS transistor P0 to P3 being coupled to a respective integrated resistor in series, a single integrated resistor 602 is provided coupled to each of the PMOS transistors.

FIG. 6B illustrates the variable resistance block 212, 408 and/or 516 according to an alternative embodiment. Again, rather than each NMOS transistor N0 to N3 being coupled to a respective integrated resistor in series, a single integrated resistor 604 is provided coupled to each of the NMOS transistors.

As with the serially coupled resistors described previously, the resistors 602 and 604 are integrated devices, for example formed of polysilicon, and preferably represent a substantial proportion of the overall resistance of the variable resistance block, for example between 50 and 90 percent, and preferably around 80 percent.

Figure 7:
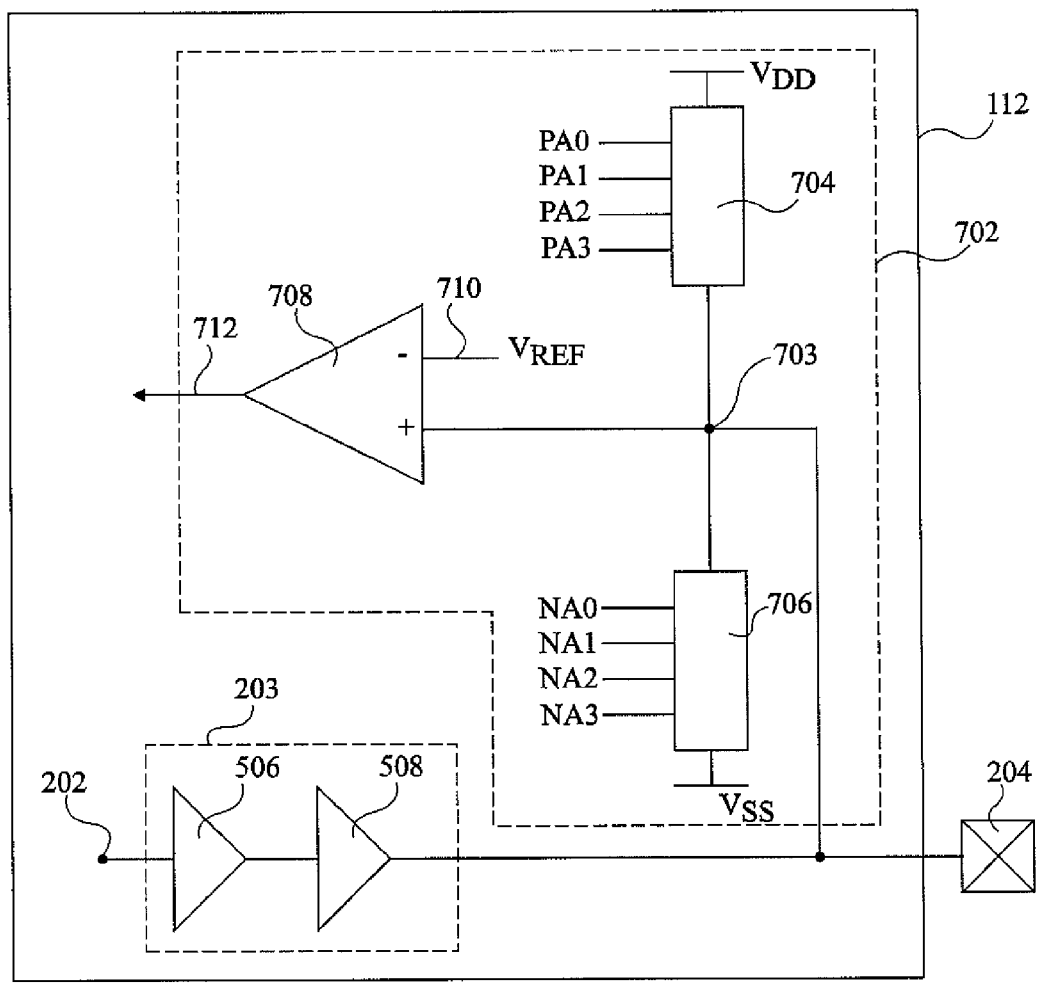
FIG. 7 illustrates a communications interface according to a further embodiment of the present invention.

FIG. 7 illustrates the communications interface 112 of FIG. 2 according to an alternative embodiment in which it comprises both output circuit 203 and an input circuit 702.

The output circuit 203 comprises the preamplifier 506 and amplifier 508 of FIG. 5 coupled to the output node 204, and these elements will not be described again in detail.

The input circuit 702 is also coupled to node 204, which in this example is coupled to a two-way transmission line. In particular, during a transmission mode, node 204 is an output node via which data amplified by amplifiers 506 and 508 may be transmitted on the transmission line. During a reception mode, node 204 is an input node via which data may be received from the transmission line.

The input circuit 702 comprises a node 703 coupled to node 204. Node 703 is coupled to the supply voltage $V_{DD}$ via a variable resistance block 704, and to supply voltage $V_{SS}$ via a variable resistance block 706. Variable resistance block 704 is for example identical to the variable resistance block 210 of FIG. 2 and is controlled by control signals PA[0:3], determined by the compensation block 214 of FIG. 2 (not shown in FIG. 7). Variable resistance block 706 is for example identical to the variable resistance block 212 of FIG. 2, and is controlled by control signals NA[0:3], determined again by the compensation block 214 of FIG. 2.

Node 703, is further coupled to a positive input of a differential amplifier 708 of the input circuit 702, which compares the signal at node 702 with a reference voltage $V_{REF}$, generally equal to $V_{DD}/2$, to provide the data signal.

Rather than comprising a single PMOS variable resistance block 704 and a single NMOS variable resistance block 706 as shown in FIG. 7, the input circuit 702 could comprise a plurality of each block coupled in parallel. Assuming that each resistance block has a resistance of 500 Ohms, five NMOS variable resistance blocks and five PMOS variable resistance blocks are for example coupled in place of blocks 704 and 706 respectively, such that each group of five variable resistance blocks has an impedance of 100 Ohms, and the overall input impedance seen from node 204 is 50 Ohms.

Figure 8:
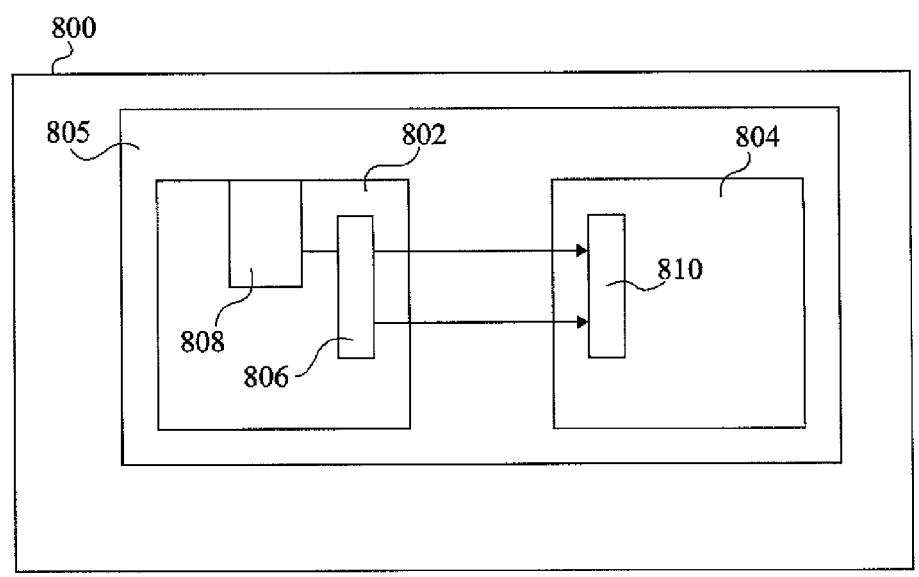
FIG. 8 illustrates an electronic device comprising circuitry according to embodiments of the present invention.

FIG. 8 illustrates a device 800 comprising chips 802 and 804, which are mounted on a support (not shown), for example a PCB. Chip 802 comprises an output circuit 806, which is connected by conducting lines on the support to the second chip 804, and in particular to input circuitry 810 of this chip. As illustrated, chip 802 also comprises compensation circuitry 808 for calibrating the impedance of the output buffers of the output circuitry 806, as described in the embodiments above.

The device 800 is for example any device in which signals are transmitted between one chip or part of a chip to a second chip or part of the chip, and in which the impedance of output buffers and/or the transition time at the input of the device 804 is to be controlled. Chip 802 could for example be part of a processor or DMA (Direct Memory Access) unit, arranged to transmit signals to the second chip 804, which could be a separate memory. The memory could for example be a flash memory, SDRAM, DRAM or other type of memory.

Device 800 is for example a portable electronics device, such as a mobile telephone, MP3 player, PDA (Personal Digital Assistant), portable games console, laptop computer, digital camera or the like.

An advantage of the embodiments described herein is that by providing a variable resistance block having a resistor coupled in series with selectable resistive elements, the impedance variations of the variable resistance block due to varying PVT conditions can be reduced. In particular, resistors tend to have a relatively linear resistance variation due to PVT conditions, whereas selectable resistive elements such as transistors have a less linear resistance variation for varying PVT conditions. Thus the use of fixed integrated resistors makes the total resistance variation of the variable resistance block more linear, and in consequence the output impedance more precise as a function of PVT variations. For varying PVT conditions, the adaptation of the impedance of the output circuit with that of the impedance of the PCB lines on which the data is to be transmitted is also more precise.

A further advantage of the embodiments described herein is that the integrated resistors of the variable resistance block provide a current that is linear with respect to the voltages applied to their terminals. The selectable elements of the variable resistance blocks are formed of MOS transistors, which do not provide a linear current, but by combining the selectable element with the integrated resistors, the MOS transistors represent a reduced proportion of the overall impedance of the variable resistance block. Thus the output impedance of the output buffer using the variable resistance blocks has improved linearity with respect to the impedance of the transmission line, and is more independent of variations in PVT conditions.

There is also an advantage when the variable resistance blocks are used in the preamplifier of the output circuit, as a means of controlling the slope of the control signals to the transistors of the output buffer. In particular, the slopes are more linear for all voltage ranges, and are more independent of variations in PVT conditions.

A further advantage of embodiments described herein is that, by determining different control signals for PMOS and NMOS transistors, differences in the impedance variations between these transistor types can be taken into account. Thus the output impedance can be more accurately controlled for both rising edges and falling edges, and also the rise time and fall time of the edges can be more equal, for varying PVT conditions.

A further advantage of the embodiments described herein is that the output circuit can be used for non-terminated applications in which the conducting line has a floating end point, as well as terminated applications, with good performance in terms of signal integrity. For example, such applications include mobile telephone DDR (double data rate) RAM.

A further advantage of the embodiments described herein is that, due to improved linearity of the variable resistance blocks, impedance variations due to temperature changes are relatively low. This means that calibration of the control signals for the variable resistance blocks can be performed only occasionally, for example once at initialization.

While a number of particular embodiments of the present invention have been described, it will be apparent to those skilled in the art that various modifications and improvements can be applied.

For example, while the present has been described using the example of MOS transistors, alternative types of transistors could be used.

Furthermore, it will apparent to those skilled in the art that the present invention may be applied too a wide range of devices, and not just the examples provided herein.

Furthermore, while in the embodiments described herein the variable resistance blocks comprise four selectable resistive elements coupled in parallel, in alternative embodiments a fewer or greater number may be provided, depending on the precision required. The greater the number of resistive elements, the greater the resistance precision that is possible. Obviously, where more resistive elements are present, more control signal bits will be used to control the variable resistance blocks.

Furthermore, the integrated resistors of the variable resistance blocks may be formed in a variety of different materials, including polycrystalline silicon (poly-Si) or other materials.

Furthermore, while one example of circuitry for controlling the variable resistance blocks has been described, other solutions are possible. Other arrangements of the variable resistance blocks are possible.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. Circuitry comprising:
an output circuit comprising a first variable resistance block coupled between a first supply voltage and an output node, the first variable resistance block comprising a first plurality of selectable resistive elements coupled in series with at least one resistor between the first supply voltage and the output node, the output circuit having an output impedance determined by the resistance of the first variable resistance block; and
a compensation circuit for regulating the impedance of the first variable resistance block of the output circuit, the compensation circuit comprising:
a second variable resistance block coupled between said first supply voltage and the first node of an external resistor, the second node of the external resistor being coupled to a second supply voltage, wherein the second variable resistance block comprises a second plurality of selectable resistive elements coupled in series with at least one resistor between the first supply voltage and the first node of the external resistor, and wherein said first and second plurality of selectable resistive elements of the first and second variable resistance blocks are selected based on a voltage level at said first node of the external resistor; and
a control block adapted to test individually at least two of the selectable resistive elements of the second plurality of selectable resistive elements in turn to determine whether each of the two selectable resistive elements should be on or off.

2. The circuitry of claim 1, wherein the plurality of selectable resistive elements of the first and second variable resistance blocks are transistors.

3. The circuitry of claim 1, wherein said at least one resistors of the first and second variable resistance blocks are integrated resistors.

4. The circuitry of claim 1, further comprising a third variable resistance block coupled between said second supply voltage and said output node and comprising a plurality of selectable resistive elements coupled in series with at least one resistor;

said compensation circuit further comprising a fourth variable resistance block coupled between the second supply voltage and a feedback node, the fourth variable resistance block comprising a plurality of selectable resistive elements coupled in series with at least one resistor, the selectable resistive elements of the third and fourth variable resistance blocks being selected based on a voltage level at the feedback node; and the resistive elements of the first and second variable resistance blocks being transistors of a first type, and the resistive elements of the third and fourth variable resistance blocks being transistors of a second type.

5. The circuitry of claim 4, wherein the compensation circuit further comprises a fifth variable resistance block identical to the second variable resistance block and coupled between the first supply voltage and the feedback node, wherein the selectable resistance elements of the fifth variable resistance block are selected based on the voltage at the first node of the external resistor.

6. The circuitry of claim 4, comprising a preamplifier comprising:
   first and second output nodes coupled to said first and third variable resistance blocks respectively;
   a sixth variable resistance block coupled to the first output node and comprising selectable resistive elements selected based on the voltage at the feedback node; and
   a seventh variable resistance block coupled to the second output node and comprising selectable resistive elements selected based on the voltage at the first node of the external resistor.

7. The circuitry of claim 6, wherein the dimensions of selectable resistive elements of the first and third variable resistance blocks are different by a determined ratio to those of the selectable resistive elements of the sixth and seventh variable resistance blocks, and the dimensions of the at least one resistor of the first and third variable resistance blocks are different by said determined ratio to the at least one resistors of the sixth and seventh variable resistance blocks.

8. The circuitry of claim 1, wherein said compensation circuit is arranged to provide a plurality of control signals, one for each of the plurality of selectable resistive elements of the first variable resistance block, said control signals determined based on the voltage at the first node of the external resistor, the output circuitry further comprising control logic arranged to control the plurality of selectable resistive elements of the first variable resistance block based on said plurality of control signals and an input signal from an input node of said output circuit.

9. The circuitry of claim 8, further comprising an input circuit comprising a third variable resistance block coupled between the first supply voltage and an input node, the third variable resistance block comprising a plurality of selectable resistive elements coupled in series with at least one resistor between the first supply voltage and the input node, the input circuit having an input impedance determined by the resistance of the third variable resistance block of the input circuit, wherein the plurality of selectable resistive elements of the third variable resistance block of the input circuit are selected based on said voltage level at said first node of the external resistor of the compensation circuit.

10. A PCB (printed circuit board) comprising first and second integrated circuits coupled together by at least one printed connection on said PCB, wherein at least one of said first and second integrated circuits comprises the circuitry of claim 1.

11. The PCB of claim 10, wherein at least one of the first and second integrated circuits is an external memory device.

12. An electronic device comprising a first integrated circuit coupled to a second integrated circuit via at least one conducting track, said first integrated circuit comprising the circuitry according to claim 1 coupled to said at least one conducting track, wherein one of said first and second integrated circuits is an external memory device.

13. A method of regulating the output impedance of an output circuit comprising a first variable resistance block coupled between a first supply voltage and an output node, the first variable resistance block comprising a first plurality of selectable resistive elements coupled in series with at least one resistor between the first supply voltage and the output node, the method comprising:
   adjusting a plurality of control signals to test individually at least two selectable resistive elements of a second plurality of selectable resistive elements in turn to determine whether each of the two selectable resistive elements should be on or off, the second plurality of resistive elements being coupled in series with at least one resistor between said first supply voltage and the first node of an external resistor, the second node of the external resistor being coupled to a second supply voltage, wherein said adjusting is based on the voltage at the first terminal of the external resistor; and
   selecting one or more of the first plurality of resistive elements of the first variable resistance block based on said plurality of control signals.

14. The method of claim 13, wherein said output circuit further comprises a third variable resistance block having a third plurality of resistive elements coupled between the second supply voltage and said output node, the method further comprising:
   adjusting a further plurality of control signals to select a fourth plurality of resistive elements in a fourth variable resistance block coupled between said second supply voltage and a feedback node, wherein said adjustment is based on the voltage at the feedback node; and
   selecting one or more of the third plurality of resistive elements of the third variable resistance block based on said further plurality of control signals.

15. The method of claim 14, wherein the resistive elements of the first and second variable resistance blocks are transistors of a first type and the resistive elements of the third and fourth variable resistance blocks are transistors of a second type different to the first type.

16. An impedance matching circuit comprising:
   a first variable resistance block configured to be coupled between a first supply voltage and an output node or input node of a circuit, the first variable resistance block comprising a first plurality of selectable resistive elements;
   an external resistor;
   a second variable resistance block configured to be coupled to the external resistor, the second variable resistance block comprising a second plurality of selectable resistive elements;
   means for testing individually at least two selectable resistive elements of the second plurality of selectable resistive elements in turn to determine whether each of the two selectable resistive elements should be on or off; and
   means for activating resistive elements of the first plurality of selectable resistive elements based on a setting of resistive elements of the second plurality of selectable resistive elements wherein the impedance of the output node or input node is determined by the resistance of the first variable resistance block.

17. The impedance matching circuit of claim 16 incorporated in at least one of a first integrated circuit coupled to a second integrated circuit by at least one printed connection on a printed circuit board.

18. The impedance matching circuit of claim 17, wherein at least one of the first and second integrated circuits comprises memory.

19. The impedance matching circuit of claim 17, wherein at least one of the first and second integrated circuits comprises a processor.

20. The impedance matching circuit of claim 17 incorporated in a device selected from the following group: a mobile telephone, an MP3 player, a personal digital assistant, a portable game console, a laptop computer, and a digital camera.

21. The impedance matching circuit of claim 16, further comprising:
- a third variable resistance block configured to be coupled between a second supply voltage and the output node or input node, the third variable resistance block comprising a third plurality of selectable resistive elements;
- a fourth variable resistance block comprising a fourth plurality of selectable resistive elements; and
- means for testing individually at least two selectable resistive elements of the fourth plurality of selectable resistive elements in turn to determine whether each of the two selectable resistive elements of the fourth plurality of selectable resistive elements should be on or off; and
- means for activating resistive elements of the third plurality of selectable resistive elements based on a setting of resistive elements of the fourth plurality of selectable resistive elements wherein the impedance of the output node or input node is further determined by the resistance of the third variable resistance block.

22. The impedance matching circuit of claim 21 incorporated in at least one of a first integrated circuit coupled to a second integrated circuit by at least one printed connection on a printed circuit board.

23. The impedance matching circuit of claim 22, wherein at least one of the first and second integrated circuits comprises memory.

24. The impedance matching circuit of claim 22, wherein at least one of the first and second integrated circuits comprises a processor.

25. The impedance matching circuit of claim 22 incorporated in a device selected from the following group: a mobile telephone, an MP3 player, a personal digital assistant, a portable game console, a laptop computer, and a digital camera.

* * * * *

UNITED STATES PATENT AND TRADEMARK OFFICE
CERTIFICATE OF CORRECTION

Page 1 of 1

PATENT NO.        : 7,902,859 B2
APPLICATION NO.   : 12/579951
DATED             : March 8, 2011
INVENTOR(S)       : Nicolas Ricard et al.

It is certified that error appears in the above-identified patent and that said Letters Patent is hereby corrected as shown below:

Col. 7, line 58, should read:
activated. The codes applied in S8 to S10 are PA[0:3]=1010, line 60, should read:
In steps S11 to S14, P2 remains on, and transistor P3 is Signed and Sealed this
Twelfth Day of April, 2011

David J. Kappos
*Director of the United States Patent and Trademark Office*